United States Patent
Lin (12)
(10) Patent No.: US 6,459,650 B1
(45) Date of Patent: Oct. 1, 2002

(54) METHOD AND APPARATUS FOR ASYNCHRONOUSLY CONTROLLING A DRAM ARRAY IN A SRAM ENVIRONMENT

(75) Inventor: Jeffrey Lin, Danville, CA (US)

(73) Assignee: JMOS Technology, Inc., Fremont, CA (US)

( * ) Notice: Subject to any disclaimer, the term of this patent is extended or adjusted under 35 U.S.C. 154(b) by 0 days.

(21) Appl. No.: 09/858,832

(22) Filed: May 15, 2001

(51) Int. Cl.$^7$ ................................................ G11C 8/00
(52) U.S. Cl. .................... 365/233; 365/189.01; 365/222
(58) Field of Search ........................... 365/233, 189.01, 365/230.06, 233.5, 222; 711/158, 105

(56) References Cited

U.S. PATENT DOCUMENTS 5,943,681 A * 8/1999 Ooishi ......................... 711/105
5,987,574 A * 11/1999 Paluch ......................... 711/158
6,240,045 B1 * 5/2001 Haraguchi et al. .......... 365/233

* cited by examiner

*Primary Examiner*—David Lam
(74) *Attorney, Agent, or Firm*—Blakely, Sokoloff, Taylor & Zafman LLP (57) ABSTRACT

A method and apparatus for asynchronously controlling a DRAM array in an SRAM environment is described. In on embodiment, this is a method of arbitrating between a refresh request and an access request. Furthermore, the access request may be either a read or a write request. Moreover, the request may be generated by a refresh control circuit within a circuit implementing the asynchronous control method. In an alternate embodiment, this is an apparatus. The apparatus includes an arbitration circuit block which may receive a refresh request and an access request. Furthermore, the access request may come as a read request or a write request, which may be implemented as separate signals. Moreover, the apparatus may include a refresh circuit block which may generate refresh control signals and the refresh request signal for the arbitration circuit.

16 Claims, 6 Drawing Sheets

METHOD AND APPARATUS FOR ASYNCHRONOUSLY CONTROLLING A DRAM ARRAY IN A SRAM ENVIRONMENT

BACKGROUND OF THE INVENTION

1. Field of the Invention

This application generally relates to semiconductor memories and more specifically to asynchronously controlling DRAM circuitry.

2. Description of the Related Art

Generally, DRAM is built as a separate integrated circuit chip from any digital logic, thus allowing for use of a specialized DRAM process and structures such as trench or other 3D capacitors. Such structures may be used to create high capacitance structures in small areas, thus leading to high DRAM cell density on the DRAM chips. However, these structures are not compatible with logic processes. Adding the high density DRAM cell to the logic process may lead to higher fabrication cost and greater yield problems due to the increase in process steps and complexity.

For memory on integrated circuit chips created through use of a logic process, SRAM memory has typically been used.; However, SRAM memory is often much less dense than DRAM memory. As a result, SRAM requires more space on a chip than DRAM does. Also, SRAM may require more power and generate a higher temperature than DRAM.

Furthermore, DRAM cells require refreshing at times, to avoid charge leakage and corresponding corruption of data. SRAM does not require refresh, due to a different cell structure. Similarly, the differing cell structure of DRAM and SRAM results in differing timing associated with read and write operations. However, it would be advantageous to make RAM available by using dense DRAM arrays without requiring logic designers to handle the complicated DRAM and refresh timing.

SUMMARY OF THE INVENTION

A method and apparatus for asynchronously controlling a dram array in an sram environment is described. In one embodiment, this is a method of arbitrating between a refresh request and an access request: Furthermore, the access request may be either a read or a write request. Moreover, the refresh request may be generated by a refresh control circuit within a circuit implementing the asynchronous control method.

In an alternate embodiment, this is an apparatus. The apparatus includes an arbitration circuit block which may receive a refresh request and an access request. Furthermore, the access request may come as a read request or a write request, which may be implemented as separate signals. Moreover, the apparatus may include a refresh circuit block which may generate refresh control signals and the refresh request signal for the arbitration circuit.

BRIEF DESCRIPTION OF THE DRAWINGS

The present invention is illustrated by way of example and not limitation in the accompanying figures.

DETAILED DESCRIPTION

A method and apparatus for asynchronously controlling a dram array in an sram environment is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments.

The method and apparatus for asynchronously controlling a dram array in an sram environment include use of an arbitrator suitable for resolving conflicts between refresh and memory access requests, and may further include use of DRAM implemented on non-DRAM process technology (such as logic, SRAM, or FLASH processes, for example). The arbitrator may be implemented as a circuit controlling access to the DRAM array. The DRAM array may thus be made to appear to function as an SRAM array from the point of view of designers attempting to couple the DRAM array to digital logic circuits.

Preferably, the DRAM refresh circuitry may include an oscillator or other timing circuit suitable for determining When a refresh needs to occur, such that access to an external refresh timer is not necessary. Similarly, access circuitry for the DRAM may include timing circuitry capable of generating various internal signals which may be necessary to DRAM functionality, such that the DRAM may appear externally to function as an SRAM array.

Figure 1A:
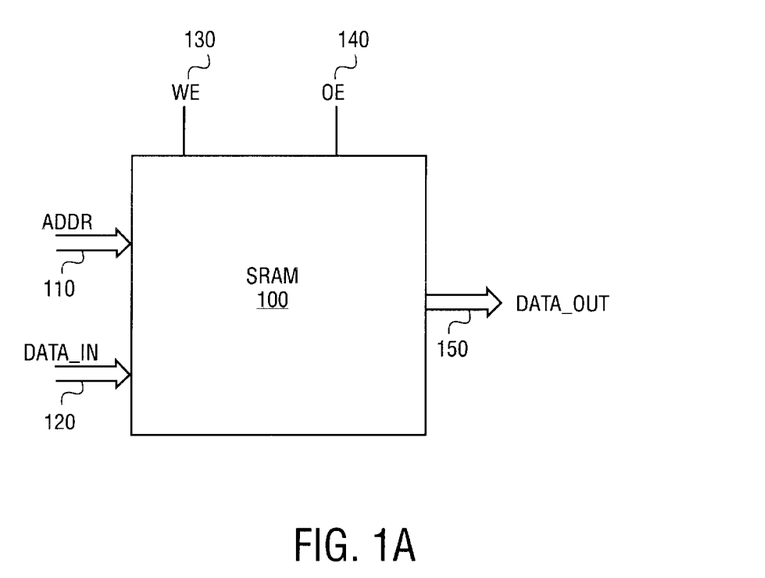
FIG. 1a illustrates an embodiment of an SRAM array.

FIG. 1a illustrates an embodiment of an SRAM array. In one embodiment, an SRAM array 100 includes an address bus 110, a data in bus 120, a write enable signal 130, an output enable signal 140 and a data out bus 150. As will be appreciated, this simple interface can be advantageous in designing memory to couple with digital logic, wherein routing resources may be relatively scarce.

Figure 1B:
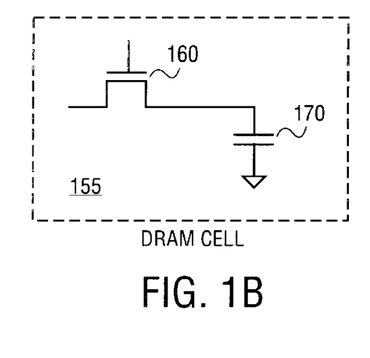
FIG. 1b illustrates an embodiment of a DRAM cell.

FIG. 1b illustrates an embodiment of a DRAM cell. DRAM cell 155 includes gate 160 which controls access to capacitor 170, and capacitor 170 stores charge which represents either a 1 or 0. Such a structure may commonly be fabricated using two transistors, one of which functions as capacitor 170.

Figure 1C:
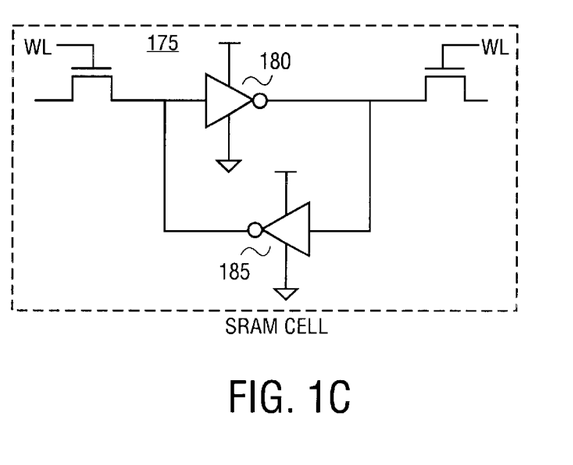
FIG. 1c illustrates an alternate embodiment of an SRAM cell.

In contrast, FIG. 1c illustrates an alternate embodiment of an SRAM cell. SRAM cell 175 includes first inverting buffer 180 and second inverting buffer 185 which are coupled together to form a loop. As illustrated, the output of buffer 180 feeds the input of buffer 185, such that the output of buffer 180 and the output of buffer 185 are of opposite values. Also illustrated are transistors controlled by a WL (wordline) signal which may be used to break the loop and thus reprogram the cell to a different value. As will be appreciated, a common SRAM cell requires at least six transistors. However, the DRAM cell 155 suffers from charge leakage through capacitor 170 which requires periodic refreshing, while the SRAM cell 175 continuously regenerates the stored values, and thereby avoids leakage.

Figure 2:
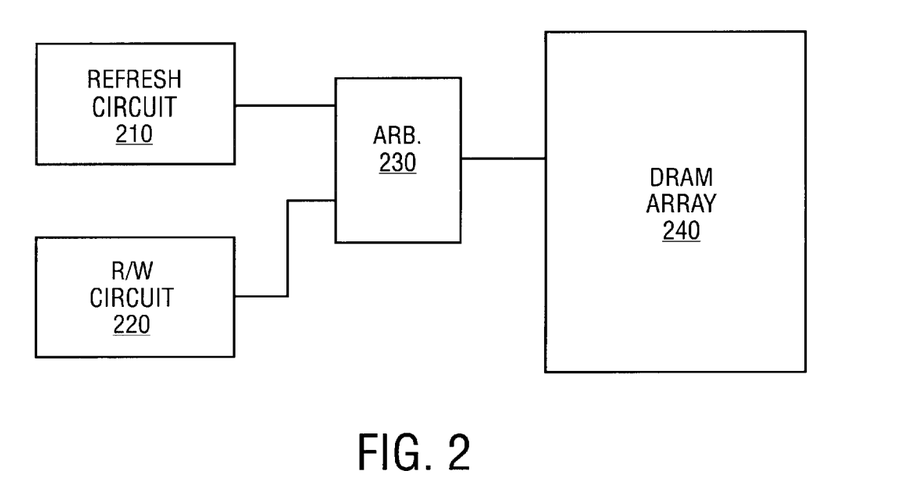
FIG. 2 illustrates an embodiment of a DRAM array utilizing an asynchronous control scheme.

FIG. 2 illustrates an embodiment of a DRAM array utilizing an asynchronous control scheme. DRAM array 240 may be accessed either by refresh circuit 210 or by access circuit (read/write) 220. Determining which of these circuits accesses DRAM array 240 is the function of arbitrator circuit 230. In one embodiment, arbitrator circuit 230 acts as a multiplexing circuit, selectively passing through signals from one of the two circuits (210, 220).

Figure 3:
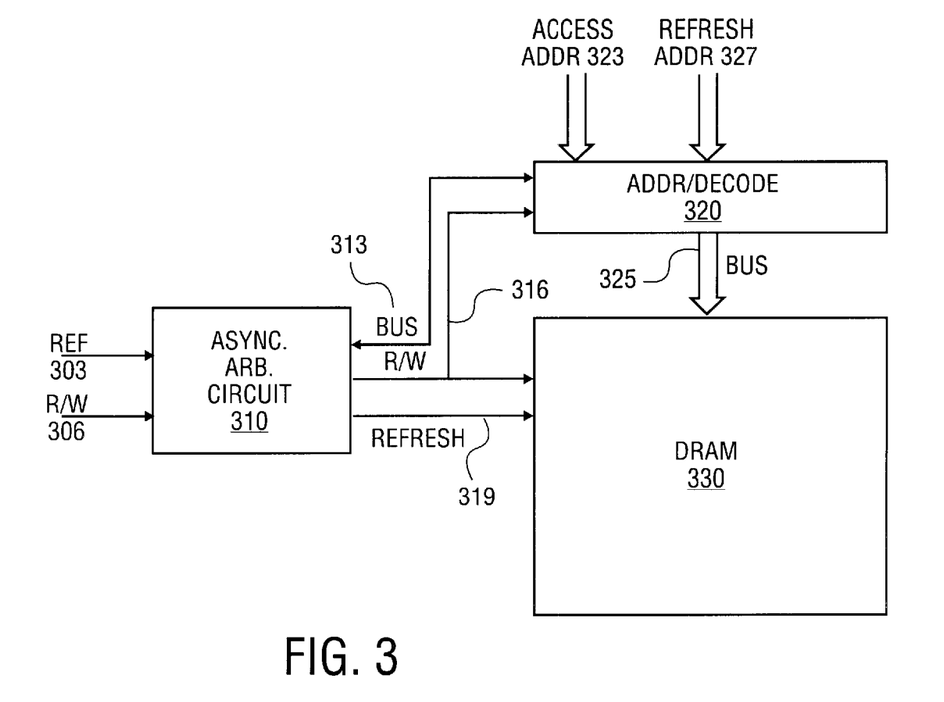
FIG. 3 illustrates an alternate embodiment of a DRAM array utilizing an asynchronous control scheme.

FIG. 3 illustrates an alternate embodiment of a DRAM array utilizing an asynchronous control scheme. DRAM array 330 is coupled directly via bus 325 to address/decode block 320. Asynchronous arbitration circuit 310 is coupled to both address/decode block 320 and DRAM array 330. Read/write signal 316 and bus 313 couple arbitration circuit 310 to address/decode block 320, whereas read/write circuit 316 and refresh circuit 319 couple arbitration circuit 310 to DRAM array 330. Arbitration circuit 310 also receives as input refresh signal 303 and read/write signal(s) 306. Arbitration circuit 310 may control the functions of address/decode circuit 320 and DRAM array 330 based on whether and how a refresh, read, or write operation should occur. Address/decode block 320 receives as input both access address 323 and refresh address 327. Access address 323 is the address for access purposes (read or write), whereas refresh address 327 is generated for purposes of refreshing the DRAM array.

Figure 4:
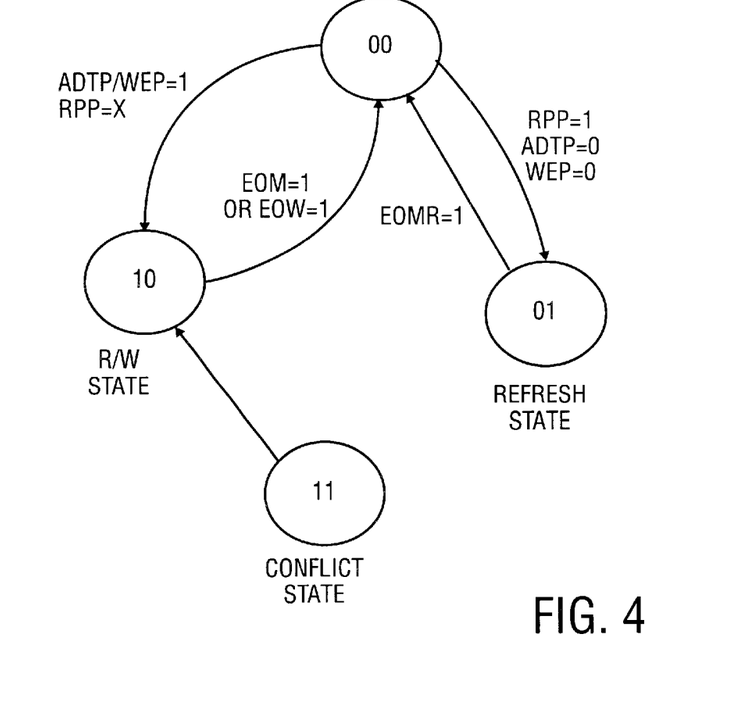
FIG. 4 illustrates an embodiment of a state diagram suitable for an asynchronous controller for a DRAM array.

FIG. 4 illustrates an embodiment of a state diagram suitable for an asynchronous controller for a DRAM array. At idle state 00, the system is quiescent, waiting for a request for either a read, write, or refresh. In one embodiment, ADTP represents an active high signal indicating that an address transition has occurred and that the DRAM array should react by reading a value for the new address. Similarly, in one embodiment, WEP is an active high signal which indicates that a write enable signal has occurred, and that the DRAM array should write data at an address currently present at the DRAM inputs. Likewise, in one embodiment, RPP is an active high signal which indicates that a refresh needs to occur. Corresponding to these signals, in one embodiment, EOM and EOW indicate that a read or a write operation has completed with an active high signal, and EOMR indicates a memory refresh operation has completed with an active high signal.

The implementation illustrated in FIG. 4 favors a read or write operation (a memory access) over a refresh operation. It will be appreciated that in some DRAM designs, refresh is necessary on the millisecond time scale, whereas memory accesses occur on the sub-microsecond time scale, so this choice of what to favor may be a suitable design decision. Thus, when a memory access request is received in the form of an ADTP signal or a WEP signal, regardless of the state of the RPP signal, the state machine transitions from an idle state 00 to a read/write state 10 and allows the memory access to proceed. Should both the ADTP and WEP happen in a relatively short time period compared to the read access time, the read request can be overridden by the write access, thus causing the read access to be skipped. As will be appreciated, the read/write state 10 only allows for transitions back to the idle state 00, thus avoiding a possibility of going directly from an access to a refresh process.

At idle state 00, in one embodiment, another possibility is to receive a refresh request as an RPP signal when neither the WEP or ADTP signals are active. In such an instance, the state machine transitions to refresh state 01 and remains there until the end of the refresh operation is signaled with an EOMR signal. Since the state machine may only transition from refresh state 01 to idle state 00, no transition from a refresh directly to a memory access will occur.

Finally, on some instances, both a refresh and an access may be signaled such that the transition to conflict state 11 may be attempted. Should such a conflict occur, the state machine naturally transitions to the read/write state, allowing access to the memory. In the case of such a conflict, the refresh signal is likely to persist, allowing refresh to occur after the access completes and the state machine transition back to the idle state 00.

Not illustrated in FIG. 4 are the signals generated at each state, which would depend on the implementation of the DRAM array. However, it will be appreciated that the designer of the DRAM array may specify such signals for control of accesses such as reads and writes and for control of refresh operations based on the exact internal structure of the array.

Figure 5:
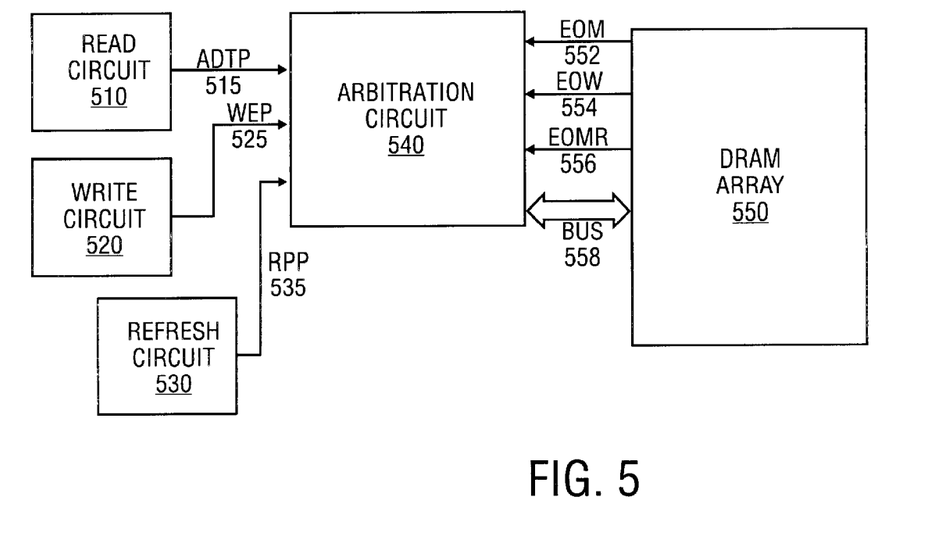
FIG. 5 illustrates an alternate embodiment of a DRAM array utilizing an asynchronous control scheme.

FIG. 5 illustrates an alternate embodiment of a DRAM array utilizing an asynchronous control scheme. Arbitration circuit 540 implements the asynchronous control scheme, such as that illustrated in FIG. 4. Read circuit 510 generates the ADTP signal 515 which is communicated to arbitration circuit 540. Similarly, write circuit 520 generates the WEP signal 525 and refresh circuit 530 generates the RPP signal 535, both signals being communicated to the,arbitration circuit 540. DRAM array 550 is coupled to arbitration circuit 540 through bus 558 and through signals EOM 552, EOW 554 and EOMR 556. Thus, arbitration circuit 540 may control DRAM array 550 through use of bus 558, and receive an indication of completion of an operation through one of signals EOM 552, EOW 554 and EOMR 556. It will be appreciated that other signals and couplings between blocks may be necessary to operate DRAM array 550, depending on the internal design of the various circuits. However, it will also be appreciated that the read circuit 510, write circuit 520, and refresh circuit 530 may be used to generate and control some signals which may be coupled directly to DRAM 550 or through arbitration circuit 540.

Figure 6A:
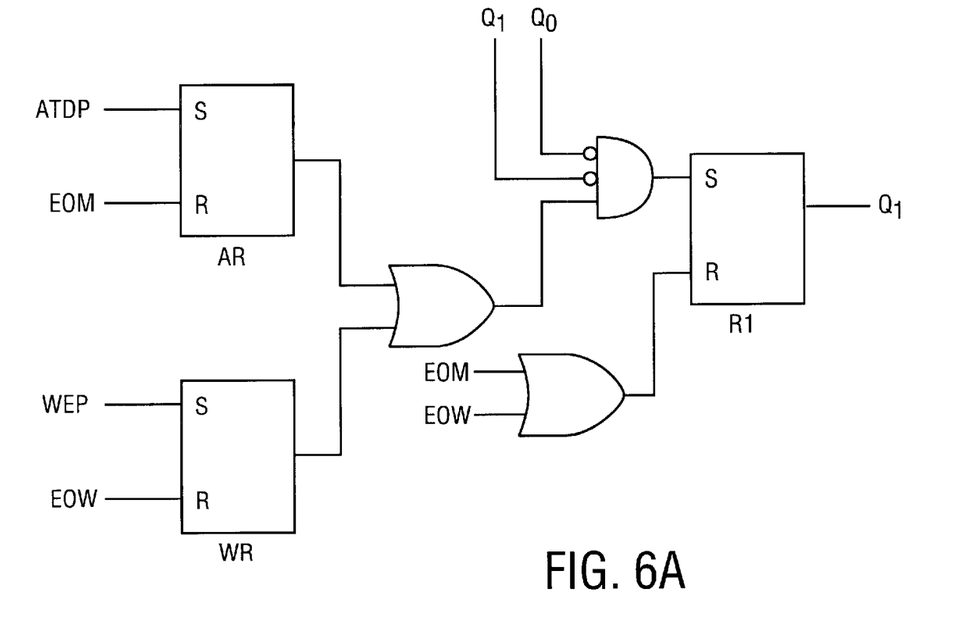
FIG. 6a illustrates an embodiment of a portion of logic suitable for implementing the asynchronous controller described by the state machine, of FIG. 4.
Figure 6B:
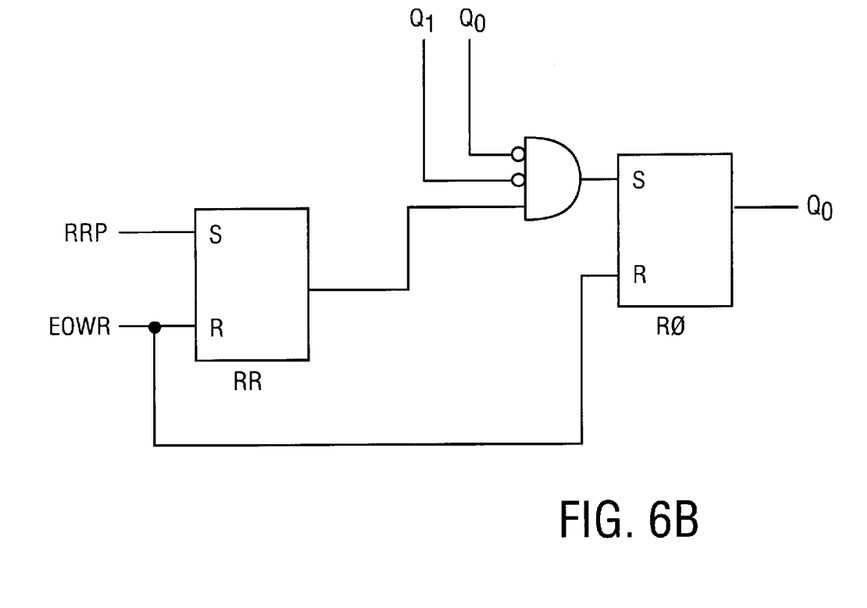
FIG. 6b illustrates an embodiment of a portion of logic suitable for implementing the asynchronous controller described by the state machine of FIG. 4.

FIG. 6a illustrates an embodiment of a portion of logic suitable for implementing the asynchronous controller described by the state machine of FIG. 4. In one embodiment, the control circuitry is a combination of S-R flip-flops and logic gates. Q0 and Q1 represent the lsb and msb (least significant and most significant bits respectively) of a state machine such as the state machine of FIG. 4. Thus, the circuit of FIG. 6a may be used to generate Q1. FIG. 6b illustrates an embodiment of a portion of logic suitable for implementing the asynchronous controller described by the state machine of FIG. 4. As with the circuit of FIG. 6a, this circuitry, in one embodiment, may be used to generate Q0. An examination of the logic implemented in FIGS. 6a and 6b will indicate that the state machine of FIG. 4, with respect to states 00, 01 and 10, is implemented.

Figure 6C:
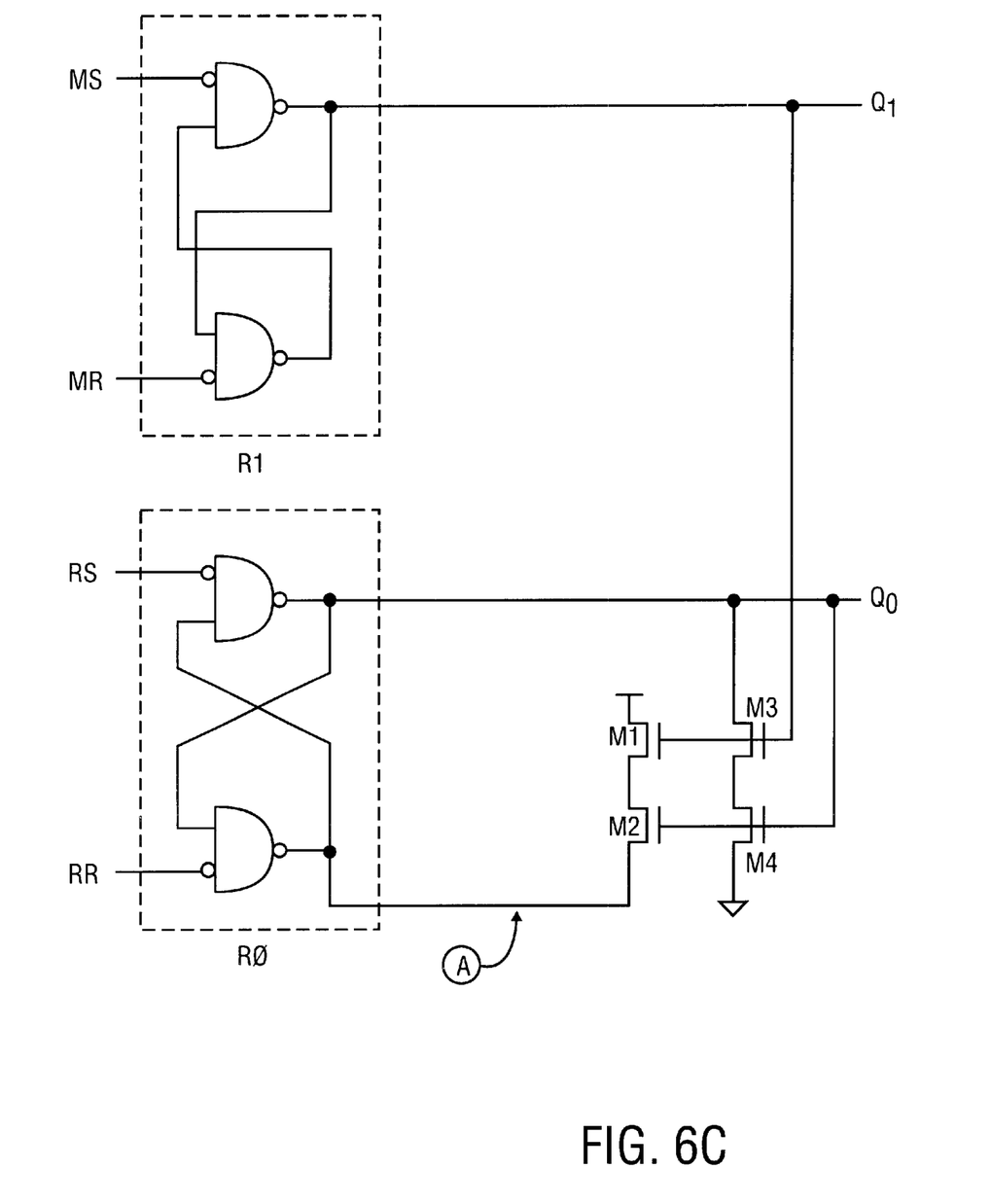
FIG. 6c illustrates an embodiment of a portion of logic suitable for implementing the asynchronous controller described by the state machine of FIG. 4.

FIG. 6c illustrates an embodiment of a portion of logic suitable for implementing the asynchronous controller described by the state machine of FIG. 4. The circuitry of FIG. 6c illustrates the internals of the two flip-flops R0 and R1. This circuitry may be used to implement the conflict resolution function of the state machine. When both Q0 and Q1 are at a logic 1 level, transistors M1, M2, M3, and M4 are all turned on to conduct. Through careful sizing of transistors, M1, M2, M3, and M4 may be used to override the outputs of gates incorporated in R0, such that node A is pulled up to a logic 1 level, and Q0 is pulled down to a logic 0 level. As Q0 goes to a logic 0 level, transistors M2 and M4 will become less conductive and eventually turn off, thus ending the override.

Figure 7:
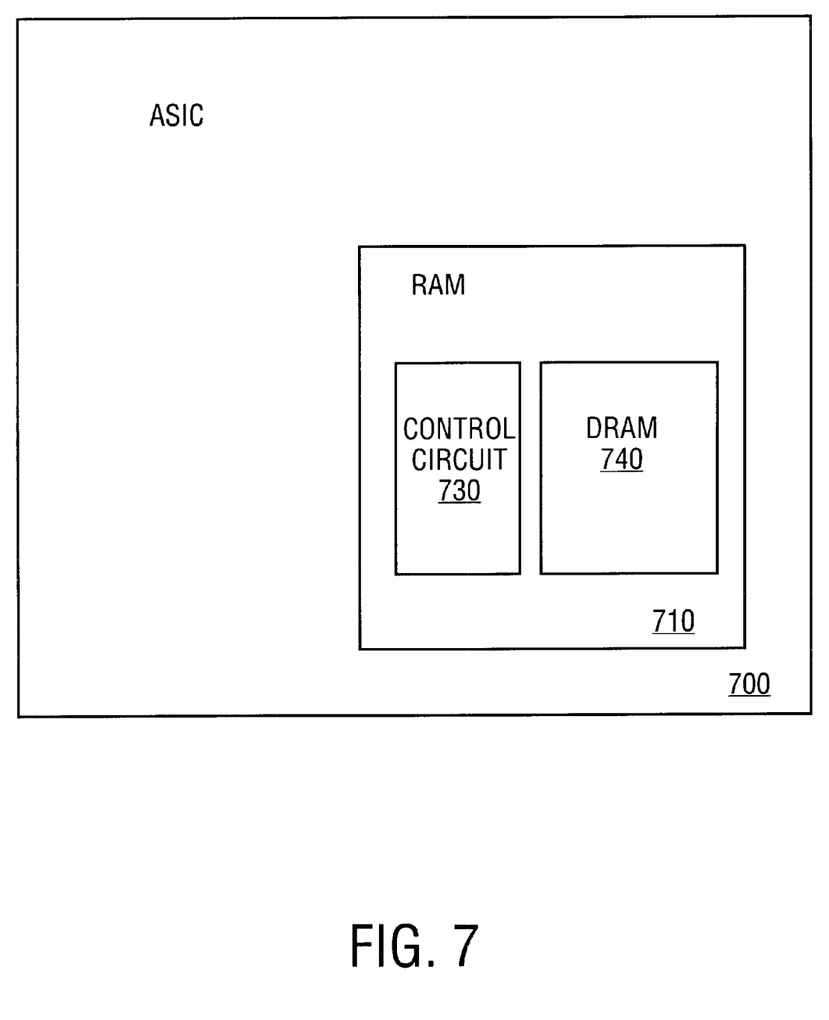
FIG. 7 illustrates an embodiment of an ASIC including a DRAM having an asynchronous controller.

FIG. 7 illustrates an embodiment of an ASIC including a DRAM having an asynchronous controller. ASIC 700 includes various logic blocks which may be coupled to RAM block 710. RAM block 710 includes control circuitry 730 and DRAM array 740. Preferably, RAM block 710 has an interface similar to that of an SRAM, with control circuitry 730 generating refresh signals and handling arbitration between the memory accesses from outside the RAM block 710 and the refresh requests. As will be appreciated, the control circuitry 730 may utilize the arbitration circuitry or methods discussed above to control the DRAM array 740.

In the foregoing detailed description, the method and apparatus of the present invention has been described with reference to specific exemplary embodiments thereof. It will, however, be evident that various modifications and changes may be made thereto without departing from the broader spirit and scope of the present invention. In particular, the separate blocks of the various block diagrams represent functional blocks of methods or apparatuses and are not necessarily indicative of physical or logical separations or of an order of operation inherent in the spirit and scope of the present invention. The various blocks of FIGS. 2 or 3 (for example) may be integrated into components, or may be subdivided into components. Moreover, the blocks of FIG. 4 may represent portions of a method which, in some embodiments, may be reordered or may be organized in parallel rather than in a linear or step-wise fashion. The present specification and figures are accordingly to be regarded as illustrative rather than restrictive.

What is claimed is:

1. A DRAM controller suitable for use in an integrated circuit, the integrated circuit also including a DRAM array, the controller comprising:
   an asynchronous control circuit having a first input, and a second input, the asynchronous control circuit to receive an indication of a memory access from the first input and the asynchronous control circuit to receive an indication of a refresh from the second input, the asynchronous control circuit to resolve a conflict, the conflict manifested when the indication of the memory access is received nearly simultaneously with the indication of the refresh, and
   the asynchronous control circuit having a set of outputs, a first output of the set of outputs to control an address input to the DRAM array, a second output of the set of outputs to control a data input to the DRAM array, la third output of the set of outputs to control a data output of the DRAM array, the asynchronous control circuit to generate a signal on each output of the set of outputs in accordance with a resolution of the conflict.

2. An ASIC (Application-Specific Integrated Circuit) comprising:
   a RAM component comprising:
      a DRAM array;
      an asynchronous control circuit coupled to the DRAM array, the asynchronous control circuit to control tho DRAM array; and wherein:
         the asynchronous control circuit includes an arbitration circuit including a state machine, the arbitration circuit to arbitrate between a memory access request and a memory refresh request, the memory refresh request to be received from within the RAM component;
         the RAM component has an SRAM interface;
         the asynchronous control circuit includes a read signal generator, a write signal generator, and a refresh signal generator, the read signal generator including random logic coupled to a set of outputs of the state machine, the write signal generator including random logic coupled to the set of outputs of the state machine, the refresh signal generator including random logic coupled to the set of outputs of the state machine, the asynchronous control circuit to control the DRAM array through use of the read signal generator, the write signal generator and the refresh signal generator.

3. The ASIC of claim 2 wherein:
   the asynchronous control circuit further includes a refresh timer, the memory refresh request generated responsive to the refresh timer.

4. A DRAM control circuit suitable for use in conjunction with a DRAM array, comprising:
   an asynchronous arbitration circuit to couple to the DRAM array, the asynchronous arbitration circuit to receive a memory access input and a memory refresh input, the asynchronous arbitration circuit to arbitrate between the memory access input and the memory refresh input to produce a set of outputs, the set of outputs configured to couple to the DRAM array to control the DRAM array;
   a read signal generator, a write signal generator, and a refresh signal generator, and wherein
      the asynchronous arbitration circuit is implemented as a state machine having a set of outputs;
      the read signal generator including random logic coupled to the set of outputs of the state machine, the write signal generator including random logic coupled to the set of outputs of the state machine, the refresh signal generator including random logic coupled to the set of outputs of the state machine,
      the asynchronous control circuit configured to control the DRAM array through use of the read signal generator, the write signal generator and the refresh signal generator.

5. The DRAM control circuit of claim 4, further comprising:
   a refresh timer, the memory refresh request generated responsive to the refresh timer.

6. A DRAM control circuit suitable for use in conjunction with a DRAM array, comprising:
   an asynchronous arbitration circuit to couple to the DRAM array, the asynchronous arbitration circuit to receive a memory access input and a memory refresh input, the asynchronous arbitration circuit to arbitrate between the memory access input and the memory refresh input to produce a set of outputs, the set of outputs configured to couple to the DRAM array to control the DRAM array;
   a read signal generator, a write signal generator, and a refresh signal generator, the asynchronous control circuit to control the DRAM array through use of the read signal generator, the write signal generator and the refresh signal generator, each of the read signal generator, the write signal generator and the refresh signal generator to generate signals responsive to the asynchronous arbitration circuit; and a refresh timer, the memory refresh request generated responsive to the refresh timer.

7. A DRAM control circuit suitable for use in conjunction with a DRAM array, comprising:

an asynchronous arbitration circuit to couple to the DRAM array, the asynchronous arbitration circuit to receive a memory read input, a memory write input and a memory refresh input, the asynchronous arbitration circuit to arbitrate between the memory read input, the memory write input and the memory refresh input to produce a set of outputs, the set of outputs to couple to the DRAM array to control the DRAM array, the asynchronous arbitration circuit implemented as a state machine having a first state, a second state, and a third state, the third state representing a memory refresh, the second state representing a memory access state, the first state representing an idle state, the state machine to transition from the first state to the second state responsive to one of a memory read input or a memory write input, the state machine to transition from the second state to the first state upon completion of a memory access, the state machine to transition from the first:state to the third state responsive to a memory refresh input in the absence of either of a memory read input or a memory write input, the state machine to transition from the third state to the first state upon completion of a memory refresh.

8. An apparatus, the apparatus for arbitrating access to a DRAM using a first output and a second output of the apparatus, the apparatus comprising:

a first SR flipflop having a set input coupled to a first input of the apparatus and a reset input coupled to a second input of the apparatus and having an output;

a second SR flipflop having a set input coupled to a third input of the apparatus and a reset input coupled to a fourth input of the apparatus and having an output;

a first OR gate having a first input coupled two the output of the first SR flipflop and having a second input coupled to the output of the second SR flipflop and having an output;

a first AND gate having a first input coupled to the output of the first OR gate and having a first inverting input coupled to the second, output of the apparatus and having a second inverting input coupled to the first output of the apparatus;

a second OR gate having a first input coupled to the second input of the apparatus and having a second input coupled to the fourth input of the apparatus and having an output;

a third SR flipflop having a set input coupled to the output of the first AND gate and having a reset input coupled to the output of the second OR gate and having an output coupled to the second output of the apparatus;

a fourth SR flipflop having a set input coupled to a fifth input of the apparatus and having a reset input coupled to a sixth input of the apparatus and having an output;

a second AND gate having a first input coupled to the output of the fourth SR flipflop and having a first inverting input coupled to the second output of the apparatus and having a second inverting input coupled to the first output of the apparatus and having an output; and a fifth SR flipflop having a set input coupled to the output of the second AND gate and having a reset input coupled to the sixth input of the apparatus and having an output coupled to the first output of the apparatus.

9. The apparatus of claim 8 wherein:

the fifth SR flipflop includes a first transistor having a first terminal coupled to a power supply node, a second terminal coupled to the second output of the apparatus and having a third terminal, the fifth SR flipflop includes a second transistor having a first terminal coupled to the third terminal of the first transistor, a second terminal coupled to the first output of the apparatus and having a third terminal, the fifth SR flipflop includes a third transistor having a first terminal coupled to the first output of the apparatus, a second terminal coupled to the second output of the apparatus and having a third terminal, the fifth SR flipflop includes a fourth transistor having a first terminal coupled to the third terminal of the third transistor, a second terminal coupled to the first output of the apparatus and having a third terminal coupled to a ground node, the fifth SR flipflop includes a first inverting AND gate having a first input coupled to the first output of the apparatus, and having a first inverting input coupled to the reset input of the fifth SR flipflop and having an output coupled to the third terminal of the second transistor, the fifth SR flipflop includes a second inverting AND gate having a first input coupled to the output of the first inverting AND gate, and having a first inverting input coupled to the set input of the fifth SR flipflop and having an output coupled to the first output of the apparatus.

10. An integrated circuit comprising:

a DRAM array;

an asynchronous control circuit coupled to the DRAM array, the asynchronous control circuit to control the DRAM array; and wherein:

the asynchronous control circuit includes an arbitration circuit including a state machine, the arbitration circuit to arbitrate between a memory access request and a memory refresh request, the memory refresh request to be received from within tho DRAM array;

the integrated circuit has an SRAM interface; and the asynchronous control circuit includes a read signal generator, a write signal generator, and a refresh signal generator, the read signal generator including random logic coupled to a set of outputs of the state machine, the write signal generator including random logic coupled to the set of outputs of the state machine, the refresh signal generator including random logic coupled to the set of outputs of the state machine, the asynchronous control circuit to control the DRAM array through use of the read signal generator, the write signal generator and the refresh signal generator.

11. The integrated circuit of claim 10 wherein:

the asynchronous control circuit further includes a refresh timer, the memory refresh request generated responsive to the refresh timer.

12. An integrated circuit comprising:

a DRAM array;

an asynchronous control circuit coupled to the DRAM array, the asynchronous control circuit to control the DRAM array, the asynchronous control circuit includes an arbitration circuit including a state machine, the arbitration circuit to arbitrate between a memory access request and a memory refresh request, the asynchronous control circuit further includes a refresh timer, the memory refresh request generated responsive to the refresh timer, the asynchronous control circuit includes a read signal generator, a write signal generator, and a refresh signal generator, the read signal generator including random logic coupled to a set of outputs of the state machine, the write signal generator including random logic coupled to the set of outputs of the state machine, the refresh signal generator including random logic coupled to the set of outputs of the state machine, the asynchronous control circuit to control the DRAM array through use of the read signal generator, the write signal generator and the refresh signal generator; and wherein the integrated circuit has an SRAM interface.

13. An ASIC (Application-Specific Integrated Circuit) comprising:

a RAM component comprising:

a DRAM array;

an asynchronous control circuit coupled to the DRAM array, the asynchronous control circuit to control the DRAM array, the asynchronous control circuit includes an arbitration circuit including a state machine, the arbitration circuit to arbitrate between a memory access request and a memory refresh request, the asynchronous control circuit further includes a refresh timer, the memory refresh request generated responsive to the refresh timer, the asynchronous control circuit includes a read signal generator, a write signal generator, and a refresh signal generator, the read signal generator including random logic coupled to a set of outputs of the state machine, the write signal generator including random logic coupled to the set of outputs of the state machine, the refresh signal generator including random logic coupled to the set of outputs of the state machine, the asynchronous control circuit to control the. DRAM array through use of the read signal generator, the write signal generator and the refresh signal generator;

and wherein:

the RAM component has an SRAM interface.

14. An apparatus comprising:

a DRAM component including:

a DRAM array;

a control component providing an SRAM interface to the DRAM array, including:

means for transmitting data to and from the DRAM array;

means for refreshing the DRAM array when not transmitting data to and from the DRAM array; and means for resolving conflicts between requests to transmit data to and from the DRAM array and requests to refresh the DRAM array, the means for resolving conflicts coupled to control the means for transmitting data and coupled to control the means for refreshing.

15. The apparatus of claim 14, wherein:

the DRAM component is a portion of an ASIC, the ASIC including a digital logic circuit.

16. The apparatus of claim 15, further comprising:

means for determining when the DRAM array should be refreshed and means for generating a request to refresh the DRAM array.

\* \* \* \* \*